United States Patent
Chapin et al.

(12) 
(10) Patent No.: US 6,325,638 B1
(45) Date of Patent: *Dec. 4, 2001

(54) ELECTRICAL ASSEMBLY FOR COUPLING TWO CIRCUIT MEMBERS

(75) Inventors: Fletcher Leroy Chapin, Maine; James Daniel Herard, Vestal, both of NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 09/431,987

(22) Filed: Nov. 2, 1999

Related U.S. Application Data

(62) Division of application No. 09/006,087, filed on Jan. 13, 1998, now Pat. No. 6,022,225, which is a division of application No. 08/655,325, filed on May 21, 1996, now Pat. No. 5,766,022.

(51) Int. Cl.[7] ....................................... H01R 9/09
(52) U.S. Cl. ............................... 439/73; 200/248
(58) Field of Search .................. 439/71, 72, 73, 439/329, 330, 331, 332; 29/359, 843, 844; 200/248

(56) References Cited

U.S. PATENT DOCUMENTS

| | | |
|---|---|---|
| 2,339,996 * | 1/1944 | Kight .................................. 200/248 |
| 4,063,791 | 12/1977 | Cutchaw . |
| 4,390,220 | 6/1983 | Benasutti . |
| 4,420,203 | 12/1983 | Aug et al. . |
| 4,683,423 | 7/1987 | Morton . |
| 4,874,318 | 10/1989 | Spencer . |
| 4,923,404 | 5/1990 | Redmond et al. . |
| 4,933,808 | 6/1990 | Horton et al. . |
| 4,956,528 * | 9/1990 | Janniere et al. ................. 200/248 X |
| 5,215,472 | 6/1993 | DelPrete et al. . |
| 5,397,245 | 3/1995 | Roebuck et al. . |
| 5,468,157 | 11/1995 | Roebuck et al. . |
| 5,766,022 * | 6/1998 | Chapin et al. ......................... 439/73 |

\* cited by examiner

*Primary Examiner*—Renee Luebke
(74) *Attorney, Agent, or Firm*—Lawrence R. Fraley

(57) ABSTRACT

An electrical assembly and actuating mechanism for use therewith in which conductor pairs of two circuit members (e.g., printed circuit board and electronic module or semiconductor chip) are effectively electrically coupled. A rigid plate is fixedly positioned relative to a first of the circuit members (e.g., using upstanding pins), a pressure plate is movably oriented relative to the rigid member, and an actuator (e.g., screw) moves within the rigid member to cause the pressure plate to engage the second circuit. Such engagement in turn causes the conductors of the second circuit member to forcibly engage the first circuit member's conductors. Solder balls and dendritic members can also be used for providing enhanced coupling without harm to either structures. The resulting assembly affords a low profile when in final position, as highly desired in the design of microelectronic packaging structures which the present invention is particularly related to. The invention also assures effective heat sinking of at least one of the circuit members.

27 Claims, 2 Drawing Sheets

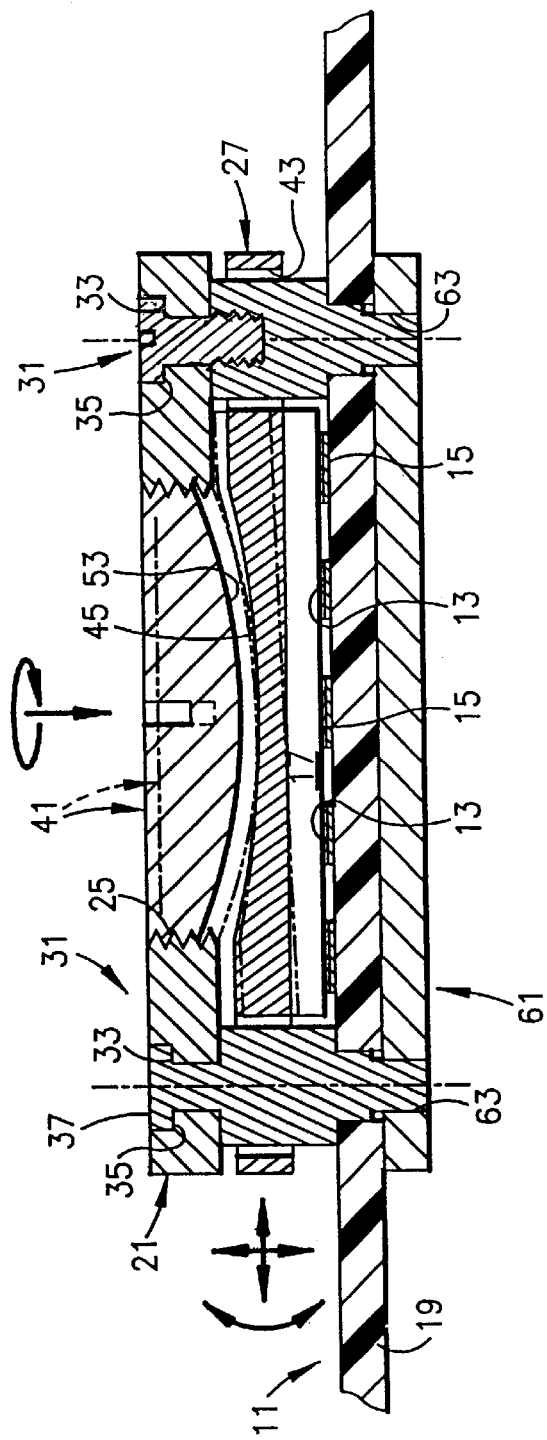
FIG.2
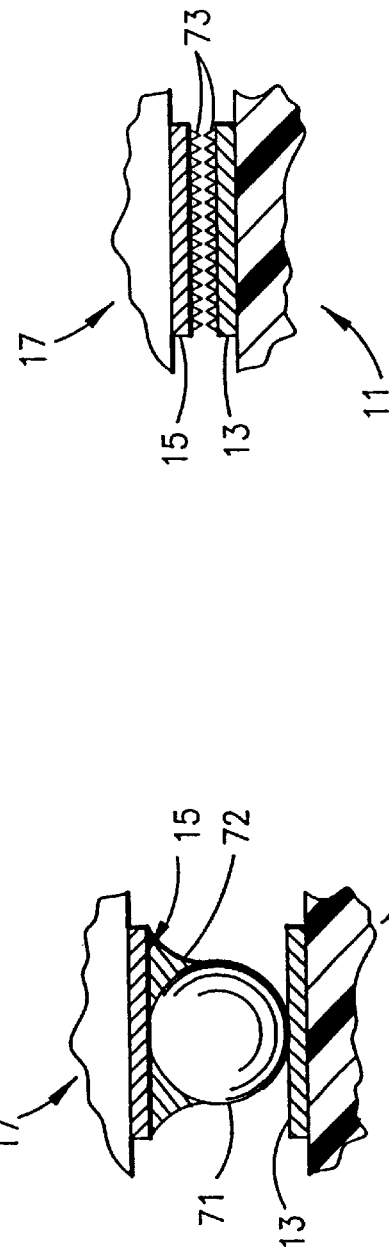
FIG.4
FIG.3

ELECTRICAL ASSEMBLY FOR COUPLING TWO CIRCUIT MEMBERS

This application is a divisional application of Ser. No. 09/006,087 (filed Jan. 13, 1998 and now U.S. Pat. No. 6,022,225) which in turn is a divisional application of Ser. No. 08/655,325 (filed May 21, 1996 and now U.S. Pat. No. 5,766,022.

TECHNICAL FIELD

This invention relates to electrical assemblies for use in information handling systems (computers) and particular to such assemblies for electrically coupling two or more circuit members such as a printed circuit board or similar circuitized substrate and a semiconductor device (chip). Even more particularly, the invention relates to such assemblies wherein one or both of the circuit members includes solder elements as a connecting medium.

CROSS REFERENCE TO COPENDING APPLICATIONS

In Ser. No. 08/536,880, there is defined a socket for use with a ball grid array package structure to couple the package to a printed circuit board. An interposer is needed for positioning between the package and board to interconnect both using specially designed contact elements also referred to as dendrites. Ser. No. 08/536,880 is entitled "Socket for Semi-Permanently Connecting a Solder Ball Grid Array Device Using a Dendrite Interposer" and was filed Sep. 29, 1995. Ser. No. 8/536,880 is now U.S. Pat. No. 5,691,041 having issued Sep. 29, 1995.

In Ser. No. 08/352,301, entitled "Method and Apparatus For In-Situ Testing of Integrated Circuit Chips" (Ser. No. 08/352,301 is a continuation application of Ser. No. 08/024,549, both now abandoned). There is described a chip testing apparatus and method in which dendrites are used to couple solder elements of a chip and conductors of the test apparatus for testing(e.g., "burn-in") of the chip. Ser. No. 08/352,301 was filed Dec. 4, 1994.

All of the above applications are assigned to the same assignee as the present invention and the disclosures of same are incorporated herein by reference.

BACKGROUND OF THE INVENTION

The use of circuit members, e.g., electronic modules, which include one or more semiconductor chips as part thereof for being electrically coupled to other circuit members referred to in the art as printed circuit boards or ceramic substrates is becoming more and more popular in the electronics packaging field. For increased wiring and input/output (I/O) densities, the use of such members wherein solder elements form the connecting medium is especially becoming more widespread. Various examples include what are referred to as ball grid array packages such as tape ball grid arrays (TBGAs), ceramic ball grid arrays (CBGAs) and plastic ball grid arrays (PBGAs), all of which include some form of substantially planar substrate on which one or more chips are coupled. These assemblies, also referred to in the art as first level packaging structures, are then coupled to another circuit member such as a printed circuit board to form what is defined in the art as a second level packaging structure. Such assemblies are then incorporated into larger processing structures for performing information handling functions.

The use of various connector apparatus for coupling different circuit members is known in the art, with examples shown and described in U.S. Letters Pat. No. 4,063,791 (Cutchaw), U.S. Letters Pat. No. 4,390,220 (Benasutti), U.S. Letters Pat. No. 4,420,203 (Awg et al), U.S. Letters Pat. No. 4,683,423 (Morton), U.S. Letters Pat. No. 4,874,318 (Spencer), U.S. Letters Pat. No. 4,923,404 (Redmond et al), U.S. Letters Pat. No. 4,933,808 (Horton et al), U.S. Letters Pat. No. 5,215,472 (DelPrete et al), U.S. Letters Pat. No. 5,397,245 (Roebuck et al) and U.S. Letters Pat. No. 5,468,157 (Roebuck et al). In U.S. Letters Pat. No. 4,063,791, e.g., chip-containing integrated circuit package is demountably positioned on a circuit board (called a backpanel in U.S. Letters Pat. No. 4,063,791) using a dielectric housing component which includes pins for coupling directly to the board's conductor elements. A cover is also utilized to cover the contained package. A somewhat similar structure is described in U.S. Letters Pat. No. 4,390,220 wherein a hold-down lid securely retains an integrated circuit package in position relative to a housing also mountable on a printed circuit board.

Connector devices for directly coupling a semiconductor chip to a circuit member such as a printed circuit board or the like are shown and described in U.S. Pat. Nos. 4,874,318, 4,683,423 and 5,468,157. In U.S. Pat. No. 4,874,318, a chip is mounted onto a circuit board using a lock nut cemented to the chip carrier and extending through a socket moulding aperture. The use of such a lock nut obviously presents a somewhat awkward structure which in turn necessitates the use of the interim socket structure, thereby adding costs to the assembly. In U.S. Pat. No. 4,683,423, a chip is electrically coupled to spring biased contact members located within a housing, such that this subassembly can then be positioned on and coupled to another circuit member. A rotational clamp is used to compress the chip onto the contact members. The requirement for utilization of several springs, strategically oriented within a housing, adds to the cost and complexity of this assembly. In U.S. Pat. No. 5,468,157, an interconnection system is described in which a semiconductor chip is electrically coupled to a "thin film interconnect" within a modular structure which also uses a threaded screw for exerting pressure onto the chip. A series of annular springs and associated plurality of shims are used as part of this connection scheme, thus adding to the cost and complexity of this design.

In accordance with the teachings of the present invention, there is provided a new and unique electrical assembly (and an actuating mechanism for use as part thereof) in which two circuit members are electrically coupled together and in which a minimum of elements are used while assuring a relatively low profile (desired for microelectronic packaging structures, including some of those mentioned above), and, significantly, while accommodating for non-planarity of the surfaces of one or more of the structure's components (e.g., the circuit board and/or chip). This latter feature is considered particularly critical when coupling extremely small, highly dense components such a semiconductor chips and the circuit members associated therewith. The invention as defined herein also provides relatively easy and simple disconnection of the electrical circuit members should this feature be desired. As understood from the following, the invention is able to provide all of these and other advantageous features discernible from the teachings hereinbelow with a minimum of components which comprise a relatively simple and inexpensive structure.

It is believed that an electrical assembly possessing the above features would represent a significant advancement in the art.

SUMMARY OF THE INVENTION

It is, therefore, a primary object of this invention to enhance the electrical assembly art by providing an assembly and an actuating mechanism possessing the several advantageous features cited hereinabove and otherwise discernible from the teachings herein.

In accordance with one embodiment of the invention, there is provided an electrical assembly comprising first and second circuit members each having a plurality of electrical conductors, a substantially rigid member fixedly positioned with respect to one of the circuit members, a pressure plate independently movable with respect to the rigid member for forcibly engaging the other circuit member, and an actuator member which is movably positioned within the rigid member for engaging the pressure plate to cause it to engage said other circuit member such that the two circuit members' conductors are engaged (coupled).

In accordance with another embodiment of the invention there is provided an actuating mechanism for causing connection between two circuit members wherein the mechanism comprises a rigid member designed for being fixedly positioned with respect to one of the circuit members, a pressure plate designed for independent movement with respect to the rigid member and for forcibly engaging the other circuit member, and an actuator member designed for engaging the pressure plate to cause it to forcibly engage said other circuit member such that connecting of the circuit members' conductors is accomplished.

BRIEF DESCRIPTION OF THE DRAWINGS

FIG. 2 is a side elevational view, in section and much enlarged over the scale in FIG. 1, illustrating the member of FIG. 1 in a coupled (actuated) position;

FIG. 3 is a much enlarged view of one of the forms of connections between the circuit members of the invention; and FIG. 4 is a much enlarged view of an alternative form of connection between two circuit members of the invention, this form of connection utilizing what are referred to in the art as dendritic connections (or dendrites).

BEST MODE FOR CARRYING OUT THE INVENTION

Figure 1:
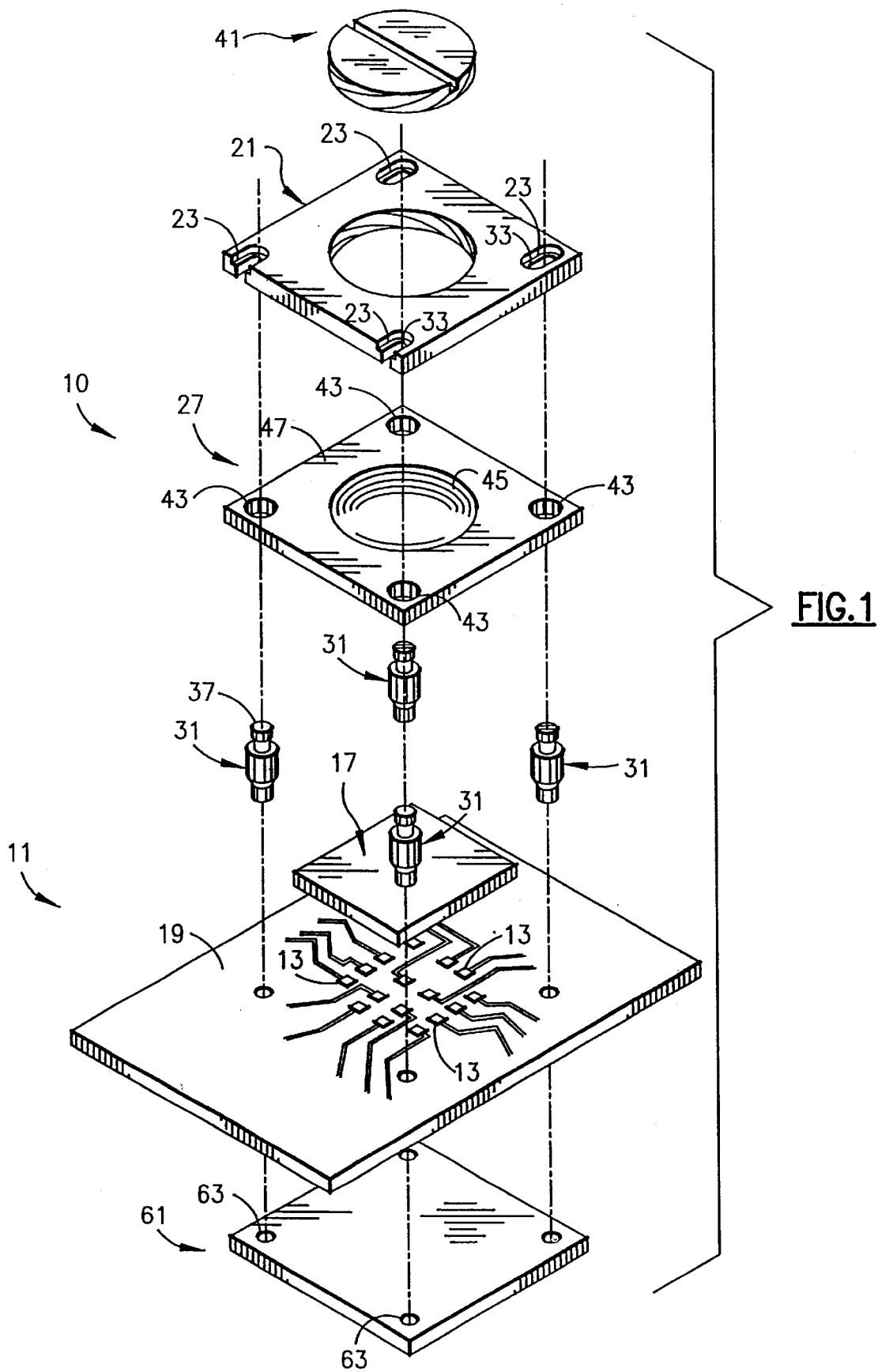
FIG. 1 is an exploded isometric view of an electrical circuit member according to one aspect of the invention.

For a better understanding of the invention, coupled with other and further advantages, capabilities and features thereof, attention is directed to the following description and appended claims in connection with the aforementioned drawings.

In FIG. 1, there is illustrated an electrical assembly 10 which includes a first circuit member 11 (e.g., a printed circuit board comprised of a dielectric base material such as fiberglass-reinforced, cured resin material also known as "FR4" material in the art) including a plurality of electrical conductors 13 (e.g., copper pads) positioned thereon in a specific pattern designed to substantially match the corresponding pattern of conductors 15 (FIG. 2) located on a second circuit member 17 (e.g., a semiconductor chip) to which these conductors will be engaged (coupled). Chip constructions and the conductors (often referred to as contact sites) used therewith are known in the art, as are printed circuit boards, such that additional description is not believed necessary. It is to be understood, however, that the invention is not limited to providing connections between only circuit boards and semiconductor chips as it is readily possible to provide effective connections between many different kinds of electrical circuits including those known as ceramic substrates, electronic modules (e.g., those with an insulative housing having one or more semiconductor chips therein and with external conductors such as copper pads or projecting leads designed for connection to the lower circuit member's conductors), etc. It is even further possible to utilize a flexible circuitized substrate (often referred to in the art as simply a "flex" circuit) which includes a dielectric layer (e.g., a known polymer, that being polyimide) having a desired highly dense pattern of conductors and associated fine wiring as its circuitry on an external surface thereof. Finally, it is also readily possible using the teachings of the instant invention to provide connections between two similar such components (e.g., two chips with facing conductors). In one embodiment, a total of 256 conductors 13 and 15 can be effectively coupled using the teachings of the invention, each of the conductors 13 being a solid copper pad of substantially rectangular configuration with a thickness of only about 0.0005 inch. These pads each may possess side dimensions of only about 0.0280 inch and 0.0280 inch, and can be spaced apart (center-to-center dimensions) only about 0.050 inch from each other, thus illustrating clearly the relatively high density connections attainable using the teachings herein. Conductors 13 may be provided on member 11 using photolithography and plating techniques well known in the art, such that further description is not believed necessary. The underlying dielectric material for member 11 may in turn possess a thickness of only about 0.062 inch, and, in one embodiment, may also be of rectangular configuration with side dimensions of four inches and ten inches. Although member 11 is described and illustrated as only having the one substantially planar layer of conductors 13 on the top surface thereof, it is clearly understood that this member may further include several internal conductive layers (e.g., those serving as ground, signal and/or power planes) and thus may represent a much more complex structure than that depicted.

As seen clearly in FIGS. 1 and 2, assembly 10 further includes a substantially rigid member 21, preferably in the form of a substantially rectangular shaped flat plate having a plurality of spaced openings 23 located at the four corners thereof. Two of these openings 23 are of closed configuration while the remaining two are of open-ended shape to thereby facilitate slidable positioning of member 21 (described below). In a preferred embodiment, member 21 is comprised of metal (e.g., aluminum) and may possess a thickness of about 0.150 inch. Alternatively, member 21 can be non-metallic, such as of a thermoplastic material. Significantly, member 21 must be of sufficient rigidity to prevent any bowing or other undesirable deflection thereof when operating as part of the invention. That is, member 21 must substantially maintain its planarity during assembly of the invention (to be described in greater detail hereinbelow). In one embodiment, member 21 is preferably substantially square with side dimensions each of about 1.5 inches. Member 21 is shown in FIGS. 1 and 2 as including a relatively large, threaded 25 opening substantially centrally positioned within the member. Of significance, member 21 is positioned relative to the first circuit member 11 through the utilization of four upstanding pins 31 which are positioned on first circuit member 1 1 and which project upwardly therefrom (see particularly FIG. 2). Pins 31 align with and are positioned within respective openings 23 of rigid member 21 when member 21 is in its fixed position. Openings 23 include upper ledges 33 which engage corresponding undersurfaces 3S of top annular portions 37 of each pin, as seen clearly in FIG. 2.

Assembly 10 further includes a pressure plate member 27 located beneath member 21 and thereby between this member and the second circuit member 17. Plate member 27, while spaced from member 21, engages the top, substantially flat surface of circuit member 17, as seen in FIG. 2. Most importantly, plate member 27 is movably positioned with respect to rigid member 21 to the extent that it is able to move both vertically and horizontally (as indicated by the perpendicular upward and downward arrows and the right and left horizontal arrows adjacent member 21 in FIG. 2), and, significantly, rotationally (as indicated by the curved arrows adjacent the aforementioned vertical arrows) when engaged by the invention's actuator member 41 (described below and shown in both solid and phantom in FIG. 2). Pressure plate member 27 forcibly engages circuit member 17 when the plate member in turn has been forcibly engagaed by actuator 41. As see in FIG. 1, plate member 27 includes a plurality (four) of openings 43 therein (at the four corners of the rectangularly shaped member) designed to accommodate respective ones of the upstanding pins 31 which pass therethrough. Openings 43 are larger in diameter than the corresponding diameters of pins 31 which pass therethrough. An example of this desired spacing is best seen in FIG. 2 wherein member 27 is seen in both activated (phantom) and unactivated (solid) positions with respect to circuit member 17. Plate member 27, unlike member 21, is substantially solid and does not include a central opening or the like therein. Instead, member 27 includes a concave, curved surface 45 in the upper surface 47 thereof, this curved surface being substantially centrally disposed in surface 47. Compared to the thickness of rigid member 21, plate member 27 is relatively thin by design (e.g., 0.050 inch thick). Member 27 is also a good thermal conductor to enhance heat sinking of the forcibly engaged circuit member 17 when member 17 is in operation. This is a particularly desirable feature should member 17 be a semiconductor chip which are known to operate at relatively high temperatures and which require effective heat sinking means to avoid possible destruction thereof. A preferred material for plate member 27 is aluminum although other sound thermally conductive materials (e.g., copper) can also be successfully utilized. It is understood that the rotational displacement of member 27 as shown in phantom in FIG. 2 is greatly exaggerated for illustration purposes. This will be better understood when discussing the invention's actuator movement during actuation of the invention. In an alternative embodiment, plate member 27 can form a part of the second circuit member and be securedly attached thereto. By way of example, second circuit member 17 can be a ceramic chip carrier having a cover, e.g., a heat-sinking member, secured thereto, e.g., with a thermal adhesive. This cover can serve as the invention's pressure plate which is then directly engaged by the invention's actuator 41. Such teachings could also be applied to other circuit members, including flexible circuits, e.g., bonding a metal plate to a flexible circuit using suitable adhesive.

In FIGS. 1 and 2, assembly 10 is further seen as comprising an actuator member 41 which, as shown, is movably positioned within rigid member 21 so as to engage plate member 27 to cause the plate member to in turn forcibly engage circuit member 17 such that the member 17 fully electrically engages the first circuit member 11 to the extent that substantially all of the conductors 13 and 15 of these two members are electrically coupled (as in FIG. 2). Actuator member 41 preferably comprises a screw member rotationally oriented within the threaded opening 25 of rigid member 21. The screw member is capable of being manually actuated using a normal screwdriver so as to effect rotation (illustrated by the curved arrow above member 41 in FIG. 2) thereof, thereby causing either upward or downward vertical movement of member 41. Other means of actuation are of course possible with the invention, including providing some form of projecting boss (not shown) such as one which might be effectively engaged by a wrench. Member 41 is preferably metallic, a specifically preferred material being aluminum as is the material for members 21 and 27. Member 41, like member 27, is shown in solid (prior to actuation) and in phantom (when fully actuated) in FIG. 2. Most significantly, screw member 41 includes a forward curved (convex) shaped surface portion 53 designed to engage the corresponding curved surface 45 of member 27. Preferably, both of these surfaces are of semi-spherical configuration each with its own predetermined radius. Significantly, the radius of screw member 41 is less than that of the curved surface 45 to facilitate engagement and corresponding motion by the engaged plate member 27. That is, effective engagement and corresponding displacement of plate member 27 depends on a proper radii relationship between these two surfaces. In one embodiment, the ratio of such radii between surfaces 45 and 53 is in the range of about 1:1.1 to about 1:1.5. Such a radii relationship assures that the convex surface 53 of screw member 41 will engage the receiving concave surface 45 such that pressure plate member 27 is able to center by virtue of its "rocking" and vertical motion when so engaged. Such movement is critical to assuring that the invention's elements provide for non-planarity of the surfaces of one or both circuit members as well as the relatively planar patterns of conductors 13 and 15. This tolerance feature is considered extremely important when engaging high density patterns of conductors on circuit members such as of the type defined herein.

Should it be desirable to provide additional rigidity for assembly 10, a backside stiffener plate member 61 may be utilized on the opposite side of circuit member 11 from members 21 and 27. Stiffener plate member 61 is preferably metallic (e.g., aluminum) but can be of any material, including thermoplastics, capable of providing additional rigidity. In one example of the invention, plate member 61 may possess a thickness of about 0.100 inch while having side dimensions substantially similar to the also rectangular shaped members 21 and 27. Plate member 61 may further include openings 63 therein designed for accommodating projecting lower end portions of pins 31, as best seen in FIG. 2. Understandably, the pins 31 can be screwed into threaded openings, may have a threaded end for accommodating a nut or the like (not shown), or may be secured by other means (e.g., a suitable adhesive). Still further, plate member 61 can also be secured directly to the underside of member 11 (e.g., again, with a suitable adhesive).

It is understood that the members 21, 27 and 41 form an actuating mechanism which can be used with two circuit members of the type defined herein to effect electrical coupling therebetween. Such a mechanism should of course also utilize some means for fixedly positioning member 21 relatively to one of the circuit members, which, as defined herein, may simply comprise a plurality of pins or posts. Alternatively, some form of clamping means may be utilized to securedly hold the lower circuit member and the elements of the actuating mechanism in precise alignment relative to one another.

In FIG. 3, there is shown the use of a solder element (e.g., a spherical ball 71) to serve as an interconnect between opposed conductors 13 and 15 of members 11 and 17, respectively. Solder ball 71 may be comprised of known solder compositions, including 63:37 tin:lead solder and in one embodiment of the invention, preferably includes a diameter of only about 0.035 inch. Significantly, the invention affords a sound connection using such relatively small elements as the conductors and solder element depicted in FIG. 3 without causing harm to said elements. In FIG. 3, solder ball 71 can be initially attached (e.g., using a suitable reflow operation) to one of the conductors (e.g., 13) and the other conductors of the remaining circuit member 17 then aligned and lowered to effect mating contact. In FIG. 3, ball 71 is shown as attached to conductor 15 with a second solder alloy 72. Reflow of the solder balls (assuming one will be used for each pair of matched conductors) can be easily accomplished in a an oven in accordance with known teachings in the art and further description is thus not believed necessary.

In FIG. 4, there is shown yet another form of connection between the invention's conductors 13 and 15, this involving the use of dendritic elements 73 which may be located on one or both of the mating conductors. Such dendritic elements are preferably formed on the respective conductors using a known electroplating process such as defined in U.S. Letter Pat. Nos. 5,137,461 and 5,185,073, both of which are assigned to the same assignee as the instant invention. Both of these patents are thus incorporated herein by reference. In a preferred example, elements 73 are comprised of palladium. Significantly, the assembly of the instant invention allows for effective meshing of the two opposing groups of dendritic elements without harm thereto. Use of dendritic elements further assures ready separability of the invention's elements as opposed to the more fixed solder reflow arrangement defined hereinabove. Effective couplings are fully attainable using both procedures, however.

Thus there has been shown and described an electrical assembly and actuating mechanism whereby two circuit members can be positively connected in a manner that assures toleration for non-planarity of the circuit members, exhibits a low profile while positioned on the lower circuit member (a highly desirous feature for today's microelectronic packaging applications), is of relatively simple and inexpensive construction, and can be relatively easily operated. The structure as defined assures centering of the mating members (21, 27) in such a manner so as to substantially prevent harm to the relatively delicate circuit members being joined.

While there have been shown and described what are at present considered the preferred embodiments of the invention, it will be obvious to those skilled in the art that various modifications and changes may be made therein without departing from the scope of the invention as defined by the appended claims.

What is claimed is:

1. An electrical assembly comprising:
 a first circuit member including a plurality of electrical conductors;
 a second circuit member including a plurality of electrical conductors adapted for electrically engaging respective ones of said electrical conductors of said first circuit member;
 a substantially rigid member positioned at a fixed distance above said first circuit member;
 a pressure plate independently movable with respect to said substantially rigid member and adapted for forcibly engaging said second circuit member; and
 an actuator member movably positioned within said substantially rigid member and adapted for engaging said pressure plate to cause said pressure plate to forcibly engage said second circuit member such that said electrical conductors of said first and second circuit members are engaged, said pressure plate moving in a rocking manner such that said pressure plate is both horizontally and vertically moved when said pressure plate engages said second circuit member.

2. The electrical assembly of claim 1 where said first circuit member comprises a printed circuit board, said electrical conductors of said first circuit member including a plurality of conductive pads.

3. The electrical assembly of claim 1 wherein said second circuit member comprises a circuitized substrate.

4. The electrical assembly of claim 3 wherein said circuitized substrate comprises an electrically insulative member having said plurality of electrical conductors thereon.

5. The electrical assembly of claim 4 wherein said circuitized substrate comprises a flexible substrate.

6. The electrical assembly of claim 4 wherein said electrically insulative member is selected from the group consisting essentially of polyimide and ceramic.

7. The electrical assembly of claim 1 wherein said second circuit member comprises a semiconductor chip.

8. The electrical assembly of claim 1 further including a plurality of upstanding pins positioned on said first circuit member, said substantially rigid member being positioned on said pins to assume said substantially fixed position with respect to said first circuit member.

9. The electrical assembly of claim 1 wherein said pressure plate is spacedly positioned from said substantially rigid member.

10. The electrical assembly of claim 9 further including a plurality of upstanding pins positioned on said first circuit member, said pressure plate including a plurality of openings therein, said pins extending through respective ones of said openings.

11. The electrical assembly of claim 1 wherein said actuator member comprises a screw member rotationally positioned within said substantially rigid member.

12. An actuating mechanism for causing electrical connection between electrical conductors of a first circuit member and respective ones of electrical conductors of a second circuit member, said mechanism comprising:
 a substantially rigid member adapted for being positioned at a fixed distance above said first circuit member;
 a pressure plate adapted for being independently movable with respect to said substantially rigid member and adapted for forcibly engaging said second circuit member; and
 an actuator member movably positioned within said substantially rigid member and adapted for engaging said pressure plate to cause said pressure plate to forcibly engage said second circuit member such that said electrical conductors of said first and second circuit members are engaged, such that said pressure plate will move in a rocking manner such that said pressure plate moves both horizontally and vertically when engaging said second circuit member.

13. The actuating mechanism of claim 12 further including a plurality of upstanding pins adapted for being positioned on said first circuit member, said substantially rigid member adapted for being positioned on said pins to assume said substantially fixed position with respect to said first circuit member.

14. The actuating mechanism of claim 12 wherein said pressure plate is spacedly positioned from said substantially rigid member.

15. The actuating mechanism of claim 14 further including a plurality of upstanding pins adapted for being positioned on said first circuit member, said pressure plate including a plurality of openings therein, said pins extending through respective ones of said openings of said pressure plate.

16. The actuating mechanism of claim 12 wherein said actuator member comprises a screw member rotationally positioned within said substantially rigid member.

17. An electrical assembly comprising:
   a first circuit member including a plurality of electrical conductors;
   a second circuit member including a plurality of electrical conductors adapted for electrically engaging respective ones of said electrical conductors of said first circuit member;
   a substantially rigid member positioned at a fixed distance above said first circuit member;
   a pressure plate independently movable with respect to said substantially rigid member and secured to said second circuit member; and
   an actuator member movably positioned within said substantially rigid member and adapted for engaging said pressure plate secured to said second circuit member to cause said second circuit member to move toward and forcibly engage said first circuit member such that said electrical conductors of said first and second circuit members are engaged, said pressure plate moving in a rocking manner such that said pressure plate moves both horizontally and vertically when engaged by said actuator.

18. The electrical assembly of claim 17 where said first circuit member comprises a printed circuit board, said electrical conductors of said first circuit member including a plurality of conductive pads.

19. The electrical assembly of claim 17 wherein said second circuit member comprises a circuitized substrate.

20. The electrical assembly of claim 19 wherein said circuitized substrate comprises an electrically insulative member having said plurality of electrical conductors thereon.

21. The electrical assembly of claim 20 wherein said circuitized substrate comprises a flexible substrate.

22. The electrical assembly of claim 20 wherein said electrically insulative member is selected from the group consisting essentially of polyimide and ceramic.

23. The electrical assembly of claim 17 wherein said second circuit member comprises a semiconductor chip.

24. The electrical assembly of claim 17 further including a plurality of upstanding pins positioned on said first circuit member, said substantially rigid member being positioned on said pins to assume said substantially fixed position with respect to said first circuit member.

25. The electrical assembly of claim 17 wherein said pressure plate is spacedly positioned from said substantially rigid member.

26. The electrical assembly of claim 25 further including a plurality of upstanding pins positioned on said first circuit member, said pressure plate including a plurality of openings therein, said pins extending through respective ones of said openings.

27. The electrical assembly of claim 17 wherein said actuator member comprises a screw member rotationally positioned within said substantially rigid member.

* * * * *